United States Patent [19]
Tsubota et al.

[11] Patent Number: 5,048,039
[45] Date of Patent: Sep. 10, 1991

[54] LASER DIODE

[75] Inventors: Takashi Tsubota; Yoji Hosoi, both of Tokyo, Japan

[73] Assignee: Oki Electric Industry Co., Ltd., Japan

[21] Appl. No.: 500,186

[22] Filed: Mar. 26, 1990

[30] Foreign Application Priority Data

Mar. 30, 1989 [JP] Japan .................................. 1-76489

[51] Int. Cl.[5] .............................................. H01S 3/19
[52] U.S. Cl. ....................................... 372/46; 372/45; 372/96
[58] Field of Search .............................. 372/96, 45, 46

[56] References Cited

U.S. PATENT DOCUMENTS 4,750,184 6/1988 Kumabe .................................. 372/45
4,799,226 1/1989 Mito ...................................... 372/46

OTHER PUBLICATIONS

Optical Communications (May 1973), vol. 8, No. 1, pp. 1-4, Kyouhei-Sakuda, Amnon Yariv, "Analysis of Optical Propagation in a Corrugated Dielectric Waveguide".

Primary Examiner—Georgia Epps
Attorney, Agent, or Firm—Edward D. Manzo

[57] ABSTRACT

A laser diode comprises a substrate, a first blocking layer having a groove, an alternate combination of a lower cladding layer and a second blocking layer, an active layer formed in the groove, and an upper cladding layer. A light-amplifying region and a light-absorbing region are formed alternately in the waveguide. Both regions are disposed periodically at a period corresponding to bragg wavelength.

12 Claims, 3 Drawing Sheets

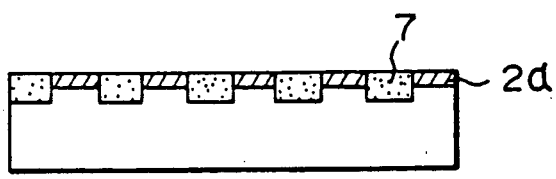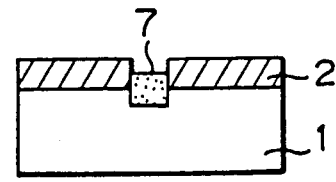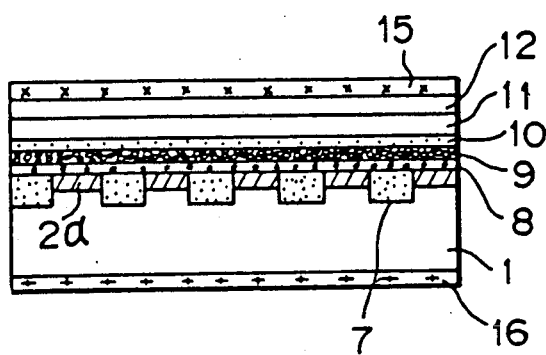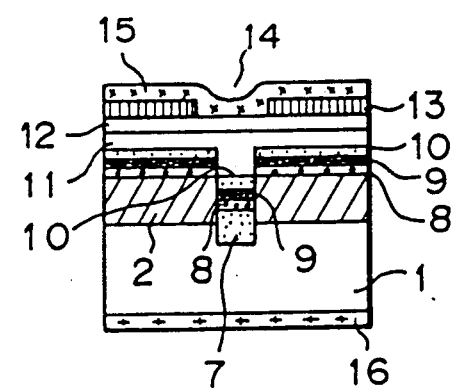

LASER DIODE

BACKGROUND OF THE INVENTION

This invention relates to a laser diode and a fabrication method thereof, more particularly to a laser diode which radiates with a selected light wavelength.

Laser diodes are employed for light source in optical transmission systems for example. In order to decrease influence of wavelength dispersion in optical fibers, laser diodes are required to radiate with a single wavelength. For the requirement, diffraction gratings are fabricated in waveguides of the diodes. A distributed feedback in laser diode (DFB-LD) employing the grating is described in "Optical Integrated Circuit—foundation and application", April 1988, Asakura shoten, Japan, for example.

In the prior DFB-LD, thickness of a medium is periodically changed to perform the grating. Thereby refractive index of a waveguide region is periodically changed. Then a light wavelength is selected in correspondence with the period of the grating, so that the DFB-LD radiates with the selected wavelength.

However, the prior DFB-LD has a stop band with bragg wavelength corresponding to the grating. Accordingly radiation is induced with two wavelengths around the bragg wavelength.

SUMMARY OF THE INVENTION

It is an object of the present invention to provide a laser diode which radiates with a single wavelength, and a method for fabricating the same.

Another object of the invention is to provide a DFB-LD which selects single wavelength, and a method for fabricating the same.

According to the present invention, a light amplification region and a light absorption region are formed alternately in the waveguide. Both regions are disposed at a period $\Lambda$ corresponding to the bragg wavelength. Thus light feedback utilizing gain coupling is performed, so that the DFB-LD of this invention radiates with single wavelength.

BRIEF DESCRIPTION OF THE DRAWINGS

FIGS. 4A to 4F and FIGS. 5A to 5F illustrate a fabrication process of the embodiment according to the invention.

DETAILED DESCRIPTION OF THE DRAWINGS

Figure 1:
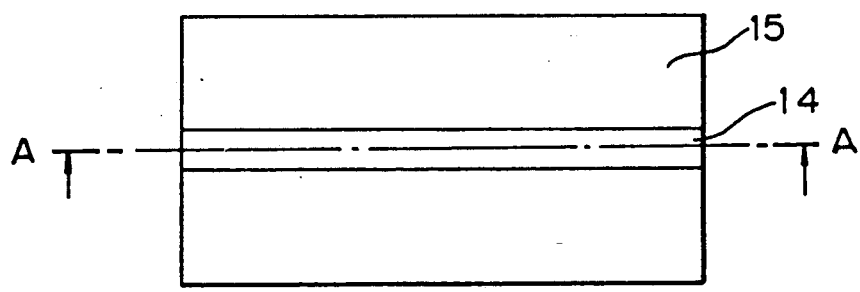
FIGS. 1 to 3 are a plan view and sectional views of an embodiment of a DFB-LD according to the present invention.
Figure 2:
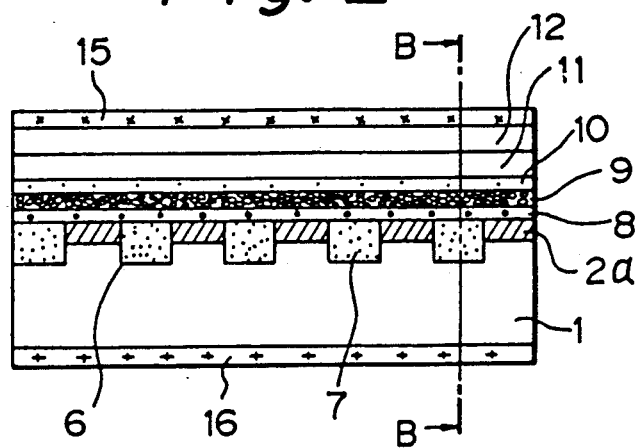
Figure 3:
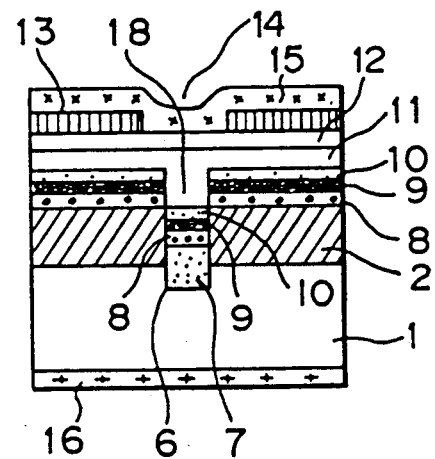

An embodiment of DFB-LD according to the present invention is illustrated in FIGS. 1 to 3. FIG. 1 shows a plan view, FIG. 2 shows a sectional view along A—A line in FIG. 1, and FIG. 3 shows a sectional view along B—B line in FIG. 2.

A first blocking layer 2 consisting of Fe-doped InP is formed on an n-InP substrate 1. A stripe-like groove 18 is fabricated into the first blocking layer 2.

As shown in FIG. 3, in the groove 18 and on the blocking layer 2, a guide layer 8, an active layer 9 and a buffer layer 10 are formed successively. The three layers consist of undoped InGaAsP. The guide layer 8 and the buffer layer 10 are employed in consideration of a characteristic of a DFB-LD. The active layer 9 on the first blocking layer 2 is not utilized for laser radiation.

In the groove 18, as shown in FIG. 2, a lower cladding layer 7 consisting of n-InP and a second blocking layer 2a are disposed along the active layer 9. The second blocking layer 2a is a part of the first blocking layer 2.

The lower cladding layer 7 and the second blocking layer 2a are disposed alternately at a specified same period $\Lambda = m\lambda/2n_e$. Where m is positive integer; $\lambda$ is light wavelength; $n_e$ is effective index. The period $\Lambda$ corresponds to bragg wavelength of the DFB-LD.

An upper cladding layer 11 consisting of p-InP is formed on the buffer layer 10, and a contact layer 12 consisting of p-InGaAsP is formed thereon. An SiN film 13 having a contact window 14 is formed on the contact layer 12. An AuZn electrode 15 is connected to the contact layer 12 through the window 14. An AnGeNi electrode 16 is formed on a bottom surface of the substrate 1.

In the structure described above, when prescribed voltage is applified to the electrodes 15 and 16, a current flows to the active layer 9 through only the lower cladding layer 7. In the active layer 9, a current injection region occurs above the lower cladding layer 7 and a non-injection region occurs above the second blocking layer 2a. Accordingly, amplification and absorption of light are repeated in light proceeding direction.

As described above, light feedback by such alternate formation, i.e. gain coupling, is utilized in the embodiment. The use of the gain coupling does not occur a stop band, so that single wavelength of laser radiation can be selected.

Next a fabrication method of the invention will be described.

FIGS. 4A to 4F and FIGS. 5A to 5F are diagrams illustrating the fabrication process of the embodiment. FIGS. 4A to 4F are sectional views corresponding to FIG. 2. FIGS. 5A to 5F are sectional views corresponding to FIG. 3.

Figure 4A:
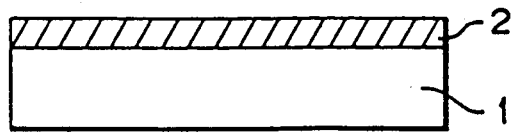
Figure 5A:
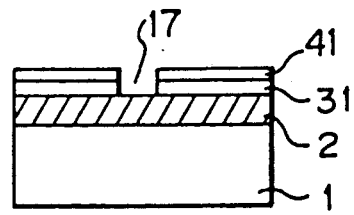

Firstly, as shown in FIGS. 4A and 5A, a first blocking layer 2(2.5 $\mu$m) consisting of Fe-doped InP is formed on a n-InP substrate 1 by chemical vapor deposition (CVD). An SiN film 31 (2000 Å) is formed on the first blocking layer 2 by plasma CVD. A positive resist 41 as a mask (1 $\mu$m) is coated on the SiN film 31 and is patterned into prescribed pattern by photolithography. Then the SiN film 31 is removed selectively by dry etching with the pattern of the resist 41, so that a stripe-like opening 17 (1.5 $\mu$m width) is formed.

Figure 4B:
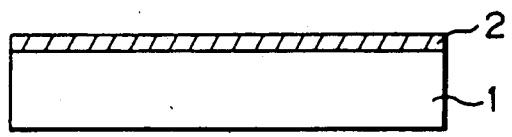
Figure 5B:
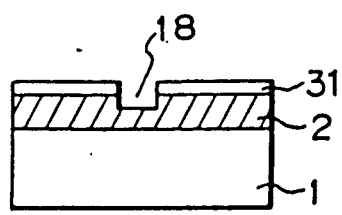

As shown in FIGS. 4B and 5B, the resist 41 is removed. Then the first blocking layer 2 is dry-etched with the SiN film 31 as a mask to fabricate a stripe-like groove 18. The groove 18 is 0.5 $\mu$m depth for example and does not pass through the blocking layer 2. Combination gas of Ar and $Cl_2$ for example is utilized for the dry etching.

Figure 4C:
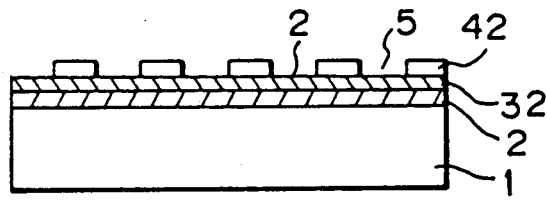
Figure 5C:
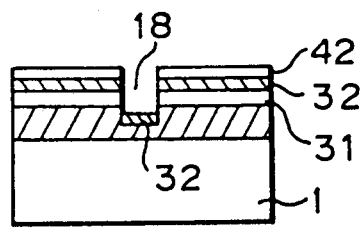

As shown in FIG. 4C and 5C, a second SiN film 32 (1000 Å) is formed in the groove 18 and on the first SiN film 31 by plasma CVD. Then a positive resist 42 (500 Å) for electron beam is coated on the above structure. Then a resist pattern 5 (2400 Å pitch) for a grating is formed by interference exposure method and development.

Figure 4D:
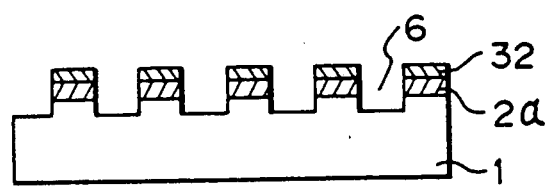
Figure 5D:
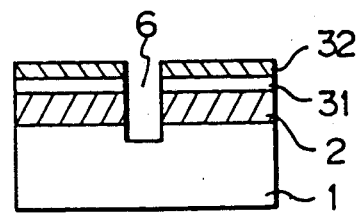

As shown in FIGS. 4D and 5D, the second SiN film 32 is removed selectively by etching with the pattern of the resist 42 as a mask, utilizing HF solution. The resist 42 is then removed. By dry etching with the second SiN film 32 as a mask, a recess 6 reaching the substrate 1 is formed. Therefore a second blocking layer 2a is formed periodically as shown in FIG. 4D. The etching gas is combination of Ar and $Cl_2$. In FIG. 4D, the recess 6 is about 1200 Å width and about 3 μm depth.

As shown in FIGS. 4E and 5E, a lower cladding layer 7 consisting of n-InP is formed in the recess 6 by MOCVD. In FIG. 5E, a top of the cladding layer 7 is below a top of the first blocking layer 2. The gap is about 0.3 μm. The SiN films 31 and 32 are then removed.

As shown in FIGS. 4F and 5F, in the groove 18 and on the first blocking layer 2, a guide layer 8 (0.1 μm thick, λg=1.3 μm), an active layer 9 (0.1 μm thick, λg=1.55 μm) and a buffer layer 10 (0.1 μm thick, λg=1.3 μm) are formed successively by liquid phase epitaxy. These layers 8, 9 and 10 consist of undoped InGaAsP. Where λg is wavelength corresponding to a bandgap of each layer. Then an upper cladding layer 11 (about 1 μm) consisting of p-InP and a contact layer 12 (0.5 μm) consisting of p-InGaAsP are formed.

Then a SiN film 13 (2000 Å) is formed on the contact layer 12 by plasma CVD. The SiN film 13 is removed selectively by photolithography, so that a stripe-like contact window 14 is formed.

Finally an AuZn electrode 15 is formed on the contact layer 12, and an AuGeNi electrode 16 is formed on a bottom of the substrate 1.

The scope of this invention is not limited to the embodiment described above, but includes many modifications and variations which will be obvious to one skilled in the art.

For example, the lower cladding layer 7 may be fabricated in the groove 18 without recess 6, by impurity diffusion or ion implantation. And, instead of the lower one, the upper cladding layer 11 may be disposed periodically.

What is claimed is:

1. A laser diode comprising:
   a substrate;
   a first blocking layer located on said substrate, and having a stripe-like groove;
   a lower cladding layer and a second blocking layer disposed alternately in said groove for forming an alternate combination thereof;
   an active layer located in said groove and located above said first blocking layer outside said groove;
   an upper cladding layer;
   a first electrode located above said upper cladding layer; and
   a second electrode located below said substrate;
   said active layer being disposed between said alternate combination and said upper cladding layer in said groove.

2. A laser diode comprising:
   a substrate;
   a first blocking layer located on said substrate, and having a stripe-like groove;
   a lower cladding layer located in said groove and on said first blocking layer outside said groove;
   an active layer located in said groove and above said lower cladding layer;
   an upper cladding layer and a second blocking layer disposed alternately in said groove for forming an alternate combination thereof;
   a first electrode located above said upper cladding layer and said alternate combination and;
   a second electrode located below said substrate;
   said active layer disposed between said lower cladding layer and said alternate combination in said groove and between said lower cladding layer and said upper cladding layer outside said groove;
   said upper cladding layer located above said active layer outside said groove.

3. A laser diode comprising:
   a substrate having a top surface and a bottom surface;
   a plurality of strips of a first blocking layer located on the top surface of said substrate;
   a groove established through said plurality of strips of said first blocking layer and in said substrate;
   a lower cladding layer located between each strip of said first blocking layer and in said groove;
   a guide layer located on said cladding layer and on said plurality of strips of said first blocking layer;
   an active layer located on said guide layer;
   a buffer layer located on said active layer;
   an upper cladding layer located on said buffer layer;
   a contact layer located on said upper cladding layer;
   a film, having a contact window, located on said contact layer;
   a first electrode coupled to said contact layer through said contact window; and
   a second electrode located on the bottom surface of said substrate.

4. A laser diode according to claim 3 wherein said substrate is located of n-InP.

5. A laser diode according to claim 3 wherein said blocking layer is comprised of Fe-doped InP.

6. A laser diode according to claim 3 wherein said guide layer, said active layer, and said buffer layer are comprised of InGaAsP.

7. A laser diode according to claim 3 wherein said lower cladding layer is comprised of n-InP.

8. A laser diode according to claim 3 wherein said upper cladding layer is comprised of p-InP.

9. A laser diode according to claim 3 wherein said contact layer is comprised of InGaAsP.

10. A laser diode according to claim 3 wherein said first electrode is an AuZn electrode.

11. A laser diode according to claim 3 wherein said second electrode is an AnGeNi electrode.

12. A laser diode comprising:
   a substrate having a top surface and a bottom surface;
   a first blocking layer located on the top surface of said substrate;
   a groove established through said first blocking layer and in said substrate;
   a lower cladding layer located on said first blocking layer and in said groove;
   a guide layer located on said guide layer;
   an active layer located on said guide layer;
   a buffer layer located on said active layer;
   a plurality of strips of a second blocking layer located on said buffer layer;
   an upper cladding layer located between each strip of said second blocking layer;
   a contact layer located on said upper cladding layer and said plurality of strips of said second blocking layer;
   a film, having a contact window, located on a contact layer;
   a first electrode coupled to said contact layer through said contact window; and
   a second electrode located on the bottom surface of said substrate.

* * * * *